(12) United States Patent
Jeong (10) Patent No.: US 8,049,201 B2
(45) Date of Patent: Nov. 1, 2011

(54) SEMICONDUCTOR MEMORY DEVICE AND METHOD OF MANUFACTURING THE SAME

(75) Inventor: Chang-wook Jeong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 325 days.

(21) Appl. No.: 12/010,735

(22) Filed: Jan. 29, 2008

(65) Prior Publication Data

US 2008/0283813 A1   Nov. 20, 2008

(30) Foreign Application Priority Data

Jan. 30, 2007   (KR) .................. 10-2007-0009495

(51) Int. Cl.
  *H01L 47/00* (2006.01)
(52) U.S. Cl. ... 257/5; 257/2; 257/E47.001; 257/E27.002
(58) Field of Classification Search .................. 257/5
    See application file for complete search history.

(56) References Cited

U.S. PATENT DOCUMENTS

| 6,998,697 | B2 | 2/2006 | Campbell et al. |
| 7,037,762 | B2 | 5/2006 | Joo et al. |
| 7,658,773 | B2 * | 2/2010 | Pinnow ........................ 29/25.03 |
| 2008/0121862 | A1 * | 5/2008 | Liu ................... 257/4 |

FOREIGN PATENT DOCUMENTS

| KR | 10-2003-0087426 | 11/2003 |
| KR | 10-2006-0089401 | 8/2005 |
| KR | 10-2006-0008027 | 1/2006 |
| KR | 10-2006-0079455 | 7/2006 |

* cited by examiner

*Primary Examiner* — Jerome Jackson, Jr.
(74) *Attorney, Agent, or Firm* — Lee & Morse, P.C.

(57) ABSTRACT

A semiconductor memory device includes first conductive lines on a substrate, an interlayer insulating layer with a plurality of via holes on the substrate, second conductive lines on the interlayer insulating layer, and a resistive memory material in the via holes and electrically connected to the first and second conductive lines, the resistive memory material having a vertically non-uniform specific resistance profile with respect to the substrate.

17 Claims, 12 Drawing Sheets

SEMICONDUCTOR MEMORY DEVICE AND METHOD OF MANUFACTURING THE SAME

BACKGROUND OF THE INVENTION

1. Field of the Invention

Embodiments of the present invention relate to a semiconductor memory device and a method of manufacturing the same. More particularly, embodiments of the present invention relate to a semiconductor memory device with a resistive memory material layer exhibiting improved operation.

2. Description of the Related Art

The use of non-volatile memory devices in portable digital appliances, such as digital cameras, mp3 players, personal digital assistants (PDA), and cellular phones has rapidly expanded. Flash memory devices are widely used as the non-volatile memory for such applications. A typical flash memory device cell comprises single floating gate MOS transistors, which may provide a highly integrated memory device at low cost.

However, as further reduction of manufacturing costs and higher integration of memory devices is desired, development continues on new memory devices that may overcome the limits of conventional flash memory devices. For example, memory devices have been developed having a memory cell structure using a resistive memory material.

The resistive memory material refers to a material with at least two stable resistive state. Application of an electrical pulse to the resistive memory material may generate heat, thereby setting the resistive memory material into an amorphous state or into a crystalline state with respect to its resistive state. The resistive memory material may have a high electrical resistance in an amorphous state and a low electrical resistance in a crystalline state. The resistive state may be reversibly switched, and the difference of resistances between the amorphous and crystalline states may be used to detect an operational state of the semiconductor memory device, e.g., a programming state or a deletion state.

However, an increased degree of integration of the semiconductor memory device may require a reduced gap between adjacent conductive lines, i.e., a reduced gap between adjacent intersection points of the first and second conductive lines. Such a reduced gap may trigger thermal interference, i.e., transfer of heat generated in the resistive memory material, between adjacent intersection points of the first and second conductive lines. For example, operational portions of the resistive memory material, i.e., portions at a state of programming and/or deletion, may transfer heat to adjacent non-operational portions of the resistive memory material. Such thermal interference may trigger, e.g., operation of non-operational portions of the resistive memory material by conversion thereof from an amorphous state into a crystalline state, thereby generating erroneous memory device operation.

SUMMARY OF THE INVENTION

Embodiments of the present invention are therefore directed to a semiconductor memory device and a method of forming the same, which substantially overcome one or more of the disadvantages of the related art.

It is therefore a feature of an embodiment of the present invention to provide a semiconductor memory device with a resistive memory material layer exhibiting reduced thermal interference between adjacent intersection points of conductive lines thereof.

It is another feature of an embodiment of the present invention to provide a method of manufacturing a semiconductor memory device having a resistive memory material layer with a reduced erroneous operation.

At least one of the above and other features and advantages of the present invention may be realized by providing a semiconductor memory device including first conductive lines on a substrate, an interlayer insulating layer with a plurality of via holes on the substrate, second conductive lines on the interlayer insulating layer, and a resistive memory material in the via holes and electrically connected to the first and second conductive lines, the resistive memory material having a vertically non-uniform specific resistance profile with respect to the substrate.

The resistive memory material may include first and second resistive memory material layers adjacent to one another, the first resistive memory material layer having a vertically different specific resistance profile with respect to the substrate as compared to the second resistive memory material layer. The first resistive memory material layer may have high specific resistance regions at lower portions thereof, and the second resistive memory material layer may have high specific resistance regions at upper portions thereof. The first and second resistive memory material layers may have an alternating matrix pattern. The first resistive memory material layer may be at intersection points of odd rows and odd columns of the matrix pattern and at intersection points of even rows and even columns of the matrix pattern. The resistive memory material may include a germanium-antimony-tellurium-based material.

The semiconductor memory device may further include lower electrodes in the via holes between the first conductive lines and the resistive memory material. Additionally, the semiconductor memory may include conductive plugs and/or diodes in the via holes between the first conductive lines and the resistive memory material. The semiconductor memory device may further include upper electrodes between the resistive memory material and the second conductive lines. The first conductive lines may be word lines and the second conductive lines may be bit lines.

At least one of the above and other features and advantages of the present invention may be realized by providing a method of manufacturing a semiconductor memory device, including forming first conductive lines on a substrate, forming an interlayer insulating layer with via holes on the substrate, forming a resistive memory material in the via holes to be electrically connected to the first conductive lines, the resistive memory material having a vertically non-uniform specific resistance profile with respect to the substrate, and forming second conductive lines to be electrically connected to the resistive memory material on the interlayer insulating layer.

Forming the resistive memory material may include depositing impurity layers at first and second depths of the resistive memory material to form respective first and second resistive memory material layers, the first and second depths being different from one another. Forming the first and second resistive memory material layers may include depositing the impurity layers to function as high specific resistance regions.

Depositing the impurity layers at the first and second depths may includes using a first ion implantation mask with first holes to implant first impurity layers at the first depth, and using a second ion implantation mask with second holes to implant second impurity layers at the second depth, the first and second impurity layers being adjacent to each other. Depositing the impurity layers may include forming the first and second impurity layers in an alternating matrix pattern, the first depth corresponding to lower portions of the first resistive memory material layer and the second depth corresponding to upper portions of the second resistive memory material layer. Depositing the impurity layers may include implanting ions of one or more of boron, carbon, nitrogen, oxygen, silicon, tantalum, tin, indium, and titanium. Implanting the impurities at the first and second depths may include using a third ion implantation mask with third holes to implant impurities at the first and second depths simultaneously by way of screen ion implantation.

The method may further include forming lower electrodes in the via holes of iridium, platinum, ruthenium, or a combination thereof. Further, the method may include forming upper electrodes in the via holes or on the resistive material. Additionally, the method may include forming conductive plugs and/or diodes in the via holes to be electrically connected to the first conductive lines.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2007-0009495, filed on Jan. 30, 2007, in the Korean Intellectual Property Office, and entitled: "Semiconductor Memory Device and Method of Manufacturing the Same," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as being limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout. The words "and/or" used in the present invention include any and all combinations of one or more of the associated listed items.

Figure 1A:
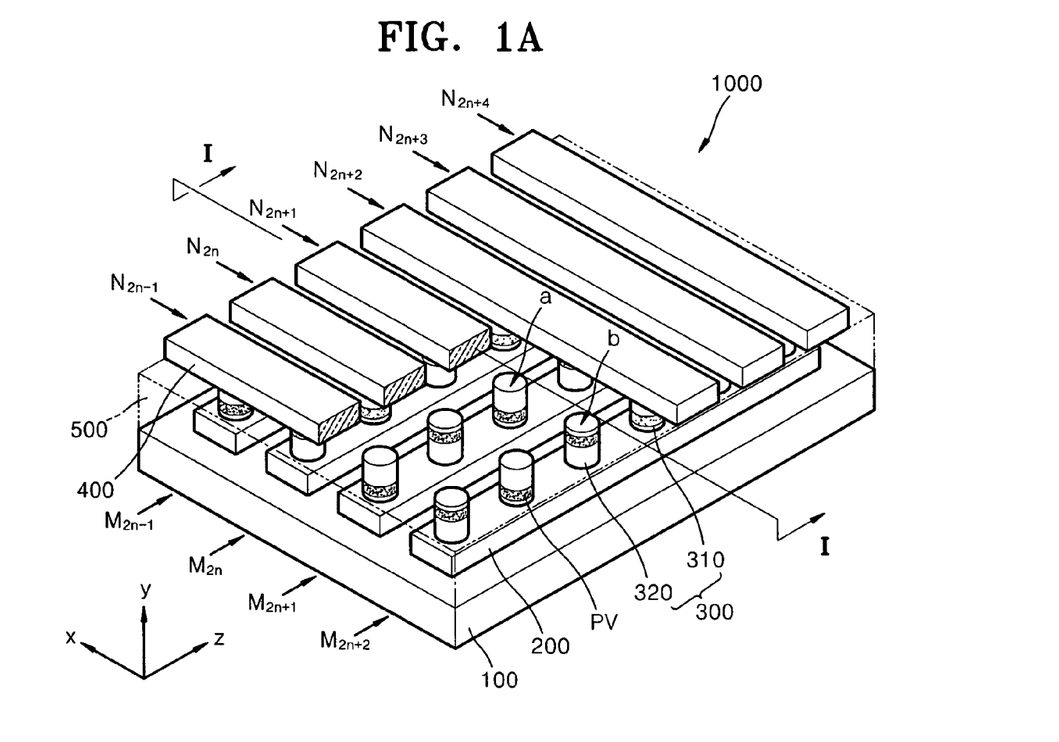
FIGS. 1A-1B illustrate perspective and cross-sectional views, respectively, of a semiconductor memory device according to an embodiment of the present invention.
Figure 1B:
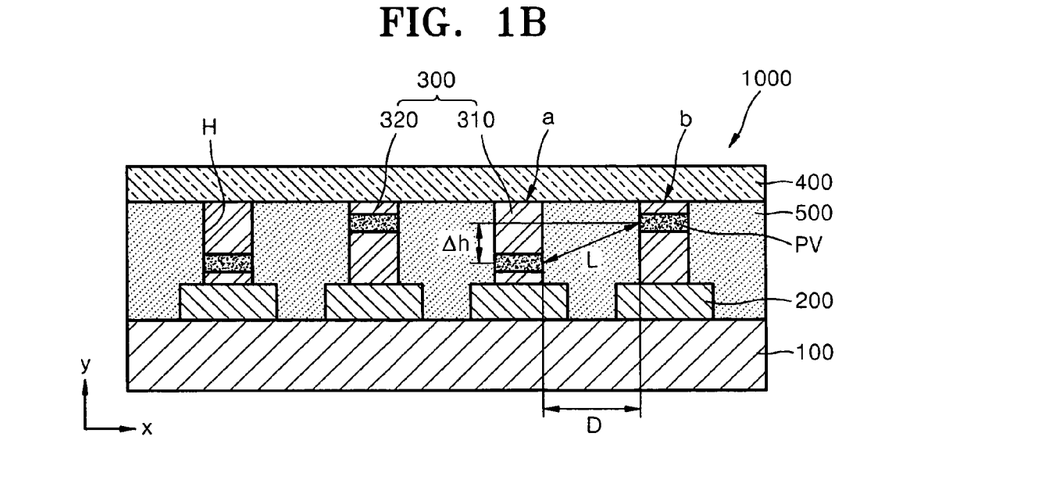

An exemplary embodiment of a semiconductor memory device, e.g., a non-volatile memory device, according to the present invention will now be described more fully with reference to FIGS. 1A-1D. As illustrated in FIGS. 1A-1B, a semiconductor memory device 1000 may include first conductive lines 200 on a substrate 100, an interlayer insulating layer 500 with via holes (H) on the substrate 100, a resistive memory material 300 in the via holes (H), and second conductive lines 400 on the interlayer insulating layer 500. The substrate 100, the first and second conductive lines 200 and 400, and the interlayer insulating layer 500 may be configured according to any suitable structure as determined by one of ordinary skill in the art in order to form the semiconductor memory device 1000, e.g., a flash memory MOS transistor. For example, the first and second conductive lines 200 and 400 may function as word and bit lines, respectively, and may intersect one another, such that the via holes (H) may be positioned therebetween at intersection points of the first and second conductive lines 200 and 400.

The resistive memory material 300 of the semiconductor memory device 1000 may be disposed in the via holes (H) of the interlayer insulating layer 500, and may be electrically connected to the first and second conductive lines 200 and 400 through the via holes (H). The resistive memory material 300 may be a discontinuous layer, so that portions of the resistive memory material 300 may be inserted into via holes (H) of the interlayer insulating layer 500. A structure of a portion of the resistive memory material 300 within a single via hole (H) may be referred to hereinafter as a "cross point," and may be between the first and second conductive lines 200 and 400 at an intersection point thereof. The cross points may be arranged, e.g., in a matrix pattern. In this respect, it should be noted that "intersection points," as opposed to "cross points," refer to locations corresponding to intersection of the first and second conductive lines 200 and 400, and do not include the physical structure of the resistive memory material 300 in the via holes (H).

In detail, the resistive memory material 300 may include first and second resistive memory material layers 310 and 320, as illustrated in FIG. 1A-1B. The first and second resistive memory material layers 310 and 320 may be adjacent to each other, and may form an alternating matrix pattern, i.e., a matrix having no identical elements positioned adjacently to each other along horizontal and/or vertical directions. For example, a cross point of the first resistive memory material layer 310 may be positioned between two cross points of the second resistive memory material layer 320 along both vertical and horizontal direction, as further illustrated in FIGS. 1A-1B. More specifically, as illustrated in FIG. 1A, the first resistive memory material layer 310 may form cross points (a), i.e., structures of the resistive memory material 300 in the via holes (H) at intersection points of odd rows ( ..., $M_{2n-1}$, $M_{2n+1}$, ... ) and odd columns ( ..., $N_{2n-1}$, $N_{2n+1}$, $N_{2n+3}$, ... ) and intersection points of even rows ( ..., $M_{2n}$, $M_{2n+2}$, ... ) and even columns ( ..., $N_{2n}$, $N_{2n+2}$, $N_{2n+4}$, ... ). The second resistive memory material layer 320 may form cross points (b), i.e., structures of the resistive memory material 300 in the via holes (H) at intersection points of odd rows ( ..., $M_{2n-1}$, $M_{2n+1}, \ldots$) and even columns ($\ldots, N_{2n}, N_{2n+2}, N_{2n+4}, \ldots$) and intersection points of even rows ($\ldots, M_{2n}, M_{2n+2}, \ldots$) and odd columns ($\ldots, N_{2n-1}, N_{2n+1}, N_{2n+3}, \ldots$).

Figure 1C:
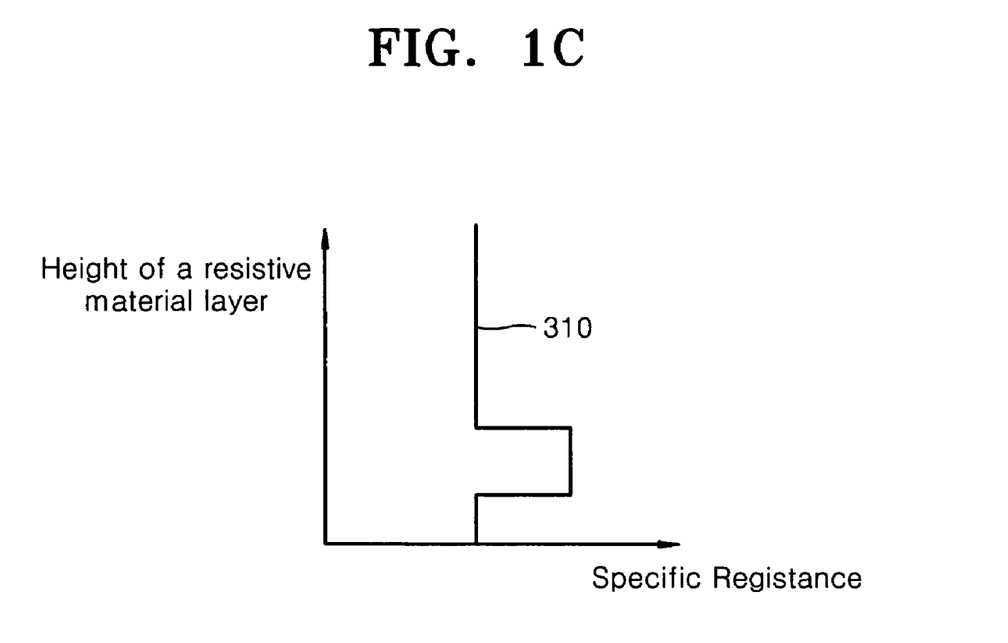
FIGS. 1C-1D illustrate graphical diagrams of specific resistance profiles of resistive memory material layers according to an embodiment of the present invention.
Figure 1D:
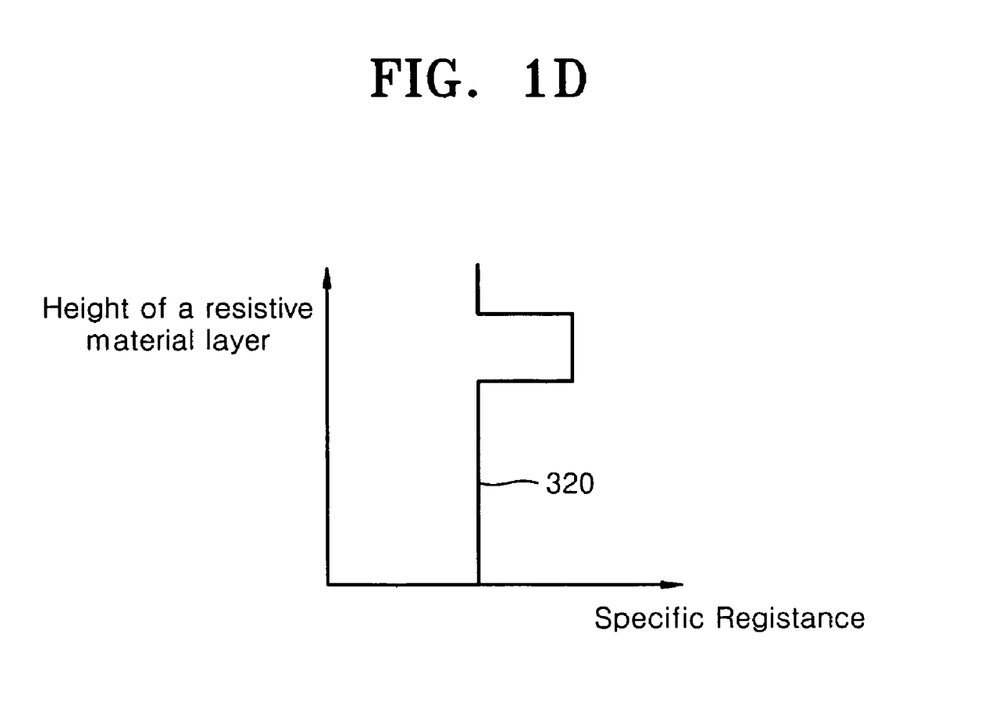

The first and second resistive memory material layers 310 and 320 may have different specific resistance profiles in a vertical direction with respect to the substrate 100. For example, the first resistive memory material layer 310 may have a high specific resistance region at a lower portion thereof, and the second resistive memory material layer 320 may have a high specific resistance region at an upper portion thereof. Alternatively, the first and second resistive memory material layers 310 and 320 may include high specific resistance regions at upper and lower portions thereof, respectively. Accordingly, the resistive memory material 300 may have a vertically non-uniform specific resistance profile. The high specific resistance regions may form programming regions (PV), as illustrated in FIG. 1B In other words, each of the first and second resistive memory material layers 310 and 320 may have vertically non-uniform specific resistance, as illustrated in FIGS. 1C-1D, so that a predetermined portion thereof may have higher specific resistance as compared to other portions thereof. Further, high specific resistance regions of the first resistive memory material layer 310 may be formed at a different vertical level as compared to the second resistive memory material layer 320, thereby forming non-uniform resistive memory material 300. The alternating matrix structure of the first and second resistive memory material layer 310 and 320 may form an alternating structure of high specific resistance regions, i.e., vertically non-uniform programming regions (PV).

Accordingly, respective programming regions (PV) of the first and second resistive memory material layers 310 and 320 may be positioned at different heights, i.e., vertical levels, with respect to the substrate 100, and may have a diagonal distance L therebetween, as illustrated in FIG. 1B. The diagonal distance L may be defined as a hypotenuse of a triangle formed between programming regions (PV) of two adjacent cross points (a) and (b), as further illustrated in FIG. 1B and as shown in Equation 1 below.

$$L=\sqrt{D^2+\Delta h^2} \qquad \text{Equation 1}$$

Where D refers to a horizontal distance between adjacent cross points (a) and (b) and Δh refers to a height difference, i.e., vertical distance, between the programming regions (PV) of the adjacent cross points (a) and (b), i.e., between adjacent first and second resistive memory material layers 310 and 320.

According to Equation 1, the diagonal distance L is longer than the horizontal distance D. Accordingly, even when a horizontal gap, i.e., the horizontal distance D, between adjacent cross points is reduced due to high integration, the distance L may be maintained by increasing the height difference Δh. Further, sufficient increase of the height difference Δh may increase the distance L between adjacent programming regions (PV), thereby minimizing heat transfer therebetween. For example, if the height difference Δh of adjacent programming regions (PV) substantially equals the horizontal distance D therebetween, the distance L between the adjacent programming regions (PV) may be about 40% longer than the horizontal distance D therebetween. Accordingly, an increase of the distance L between adjacent programming regions (PV) may decrease heat transfer therebetween, so that incorrect activation of programming regions in the resistive memory material 300 may be substantially minimized, thereby reducing erroneous programming and/or deletion operations of the semiconductor memory device 1000.

In other words, the vertically non-uniform specific resistance profile of the resistive memory material 300 may be advantageous in increasing distance between adjacent programming regions (PV), thereby minimizing heat transfer therebetween. When a resistive memory material layer with a uniform specific resistance profile in the vertical direction, i.e., uniform specific resistance throughout the resistive memory material layer, is used in a conventional semiconductor memory device, programming regions may be uniformly formed in central portions of cross points thereof, thereby providing for a small distance therebetween, i.e., a horizontal distance that substantially equals a gap between adjacent cross points, upon high integration. However, the non-uniform specific resistance profile of the resistive memory material 300 according to embodiments of the present invention may facilitate formation of programming regions that are offset from one another with respect to the horizontal plane. Accordingly, distances between the programming regions may be controlled to be sufficiently large for substantially minimizing or preventing erroneous programming and/or deletion operations thereof.

The resistive memory material 300 may include any phase changing material. For example, the resistive memory material 300 may include a germanium-antimony-tellurium (GeSbTe)-based material, e.g., $GeSb_2Te_3$, $Ge2Sb_2Te_5$, $GeSb_2Te_4$, $GeTeSb_2Te_3Sb$, GeSbTePd, and so forth. Additional materials that may be used for forming the resistive memory material 300 may be one or more of GeTeAs, GeSnTe, SeSnTe, GaSeTe, GeTeSnAu, $SeSb_2$, InSe, GeTe, BiSeSb, PdTeGeSn, InSeTiCo, InSbTe, $In_3SbTe_2$, AgInSbTe, and so forth. In addition, the resistive memory material 300 may include a non-metallic impurity element, e.g., boron (B), carbon (C), nitrogen (N), oxygen (O), and/or silicon (Si), or a metallic impurity element, e.g., tantalum (Ta), tin (Sn), indium (In), titanium (Ti), and so forth. The metallic or non-metallic impurities may be implanted in the phase changing material of the resistive memory material 300 to facilitate formation of the programming regions (PV) at different vertical positions in the resistive memory material 300, as will be discussed in more detail below. A level of the specific resistance at each cross point may be determined with respect to a concentration of the impurity implanted therein.

A method of manufacturing the semiconductor memory device 1000 may include formation of the resistive memory material 300 in the via hole (H), so that adjacent cross points of the semiconductor memory device 1000 may have different vertical specific resistance profiles with respect to the substrate 100.

Figure 2A:
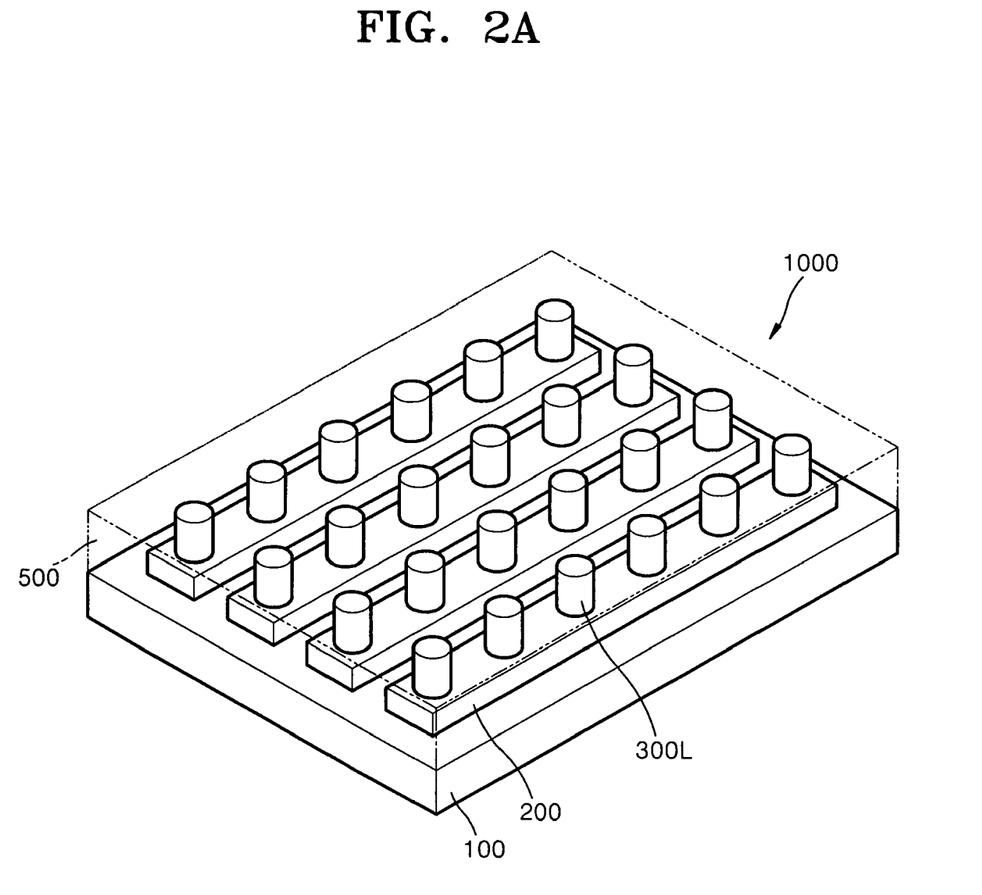
FIGS. 2A-2C illustrate perspective views of sequential steps during a manufacturing method of a semiconductor memory device according to an embodiment of the present invention.

More specifically, as illustrated in FIG. 2A, the first conductive lines 200 may be formed of metal, e.g., aluminum or tungsten. The first conductive lines 200 may be formed as a plurality of longitudinal lines arranged in any suitable pattern, e.g., a stripe-pattern, on the substrate 100 in a first direction. Then, the interlayer insulating layer 500 may be disposed on the first lines 200, followed by formation of the via holes (H) therethrough to expose upper surfaces of the first conductive lines 200. The via holes (H) may be configured, e.g., in a matrix pattern.

Once the via holes (H) are formed, a resistive memory material film (not shown) may be deposited on the interlayer insulting layer 500 to fill the via holes (H) of the interlayer insulating layer 500. The resistive memory material film may be formed of, e.g., a germanium-antimony-tellurium (GeSbTe)-based material, GeTeAs, GeSnTe, SeSnTe, GaSeTe, GeTeSnAu, $SeSb_2$, InSe, GeTe, BiSeSb, PdTeGeSn, InSeTiCo, InSbTe, $In_3SbTe_2$, AgInSbTe, and so forth. Next, the resistive memory material film may be planarized, e.g., by chemical mechanical polishing (CMP) or etch back processing, to expose an upper surface of the interlayer insulating layer 500, so that a planarized resistive memory material 300L with a predetermined height is formed in the via holes (H), as illustrated in FIG. 2A.

Figure 2B:
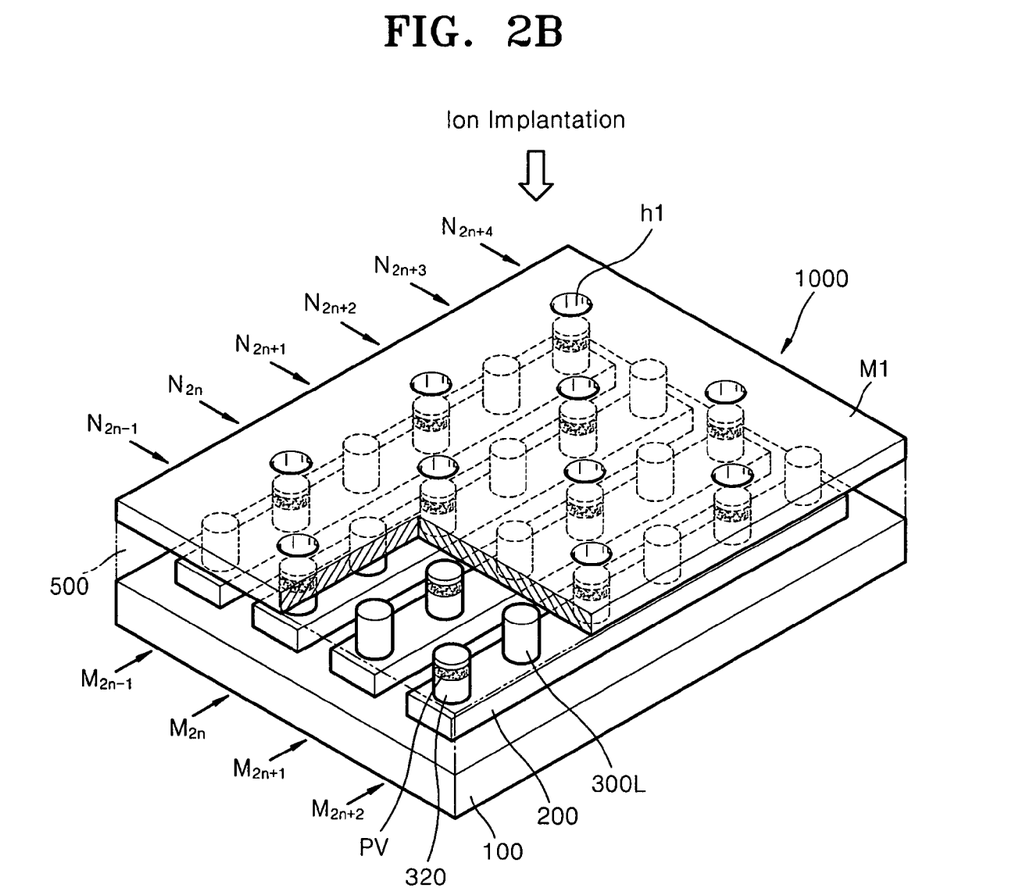

Subsequently, impurity layers may be formed in the planarized resistive memory material 300L to form regions with different specific resistance profiles at different vertical heights. The impurity layers may be formed by depositing impurity elements, such as non-metallic elements, e.g., boron (B), carbon (C), nitrogen (N), oxygen (O), and/or silicon (Si), or metallic elements, e.g., tantalum (Ta), tin (Sn), indium (In), titanium (Ti), and so forth. More specifically, as illustrated in FIG. 2B, a first mask M1, e.g., a photoresist mask, having first holes (h1) may be positioned above the interlayer insulating layer 500, so that the first holes (h1) may correspond to a predetermined portion of the planarized resistive memory material 300L, i.e., a predetermined number of via holes (H). For example, the first holes (h1) of the first mask layer M1 may completely overlap with cross points (b). Then, impurity elements may be implanted at first depths, e.g., via ion implantation, into the exposed resistive memory material films 300L through the first holes h1 of the first mask M1, thereby forming programming regions (PV) at the first depth of the cross points (b).

Figure 2C:
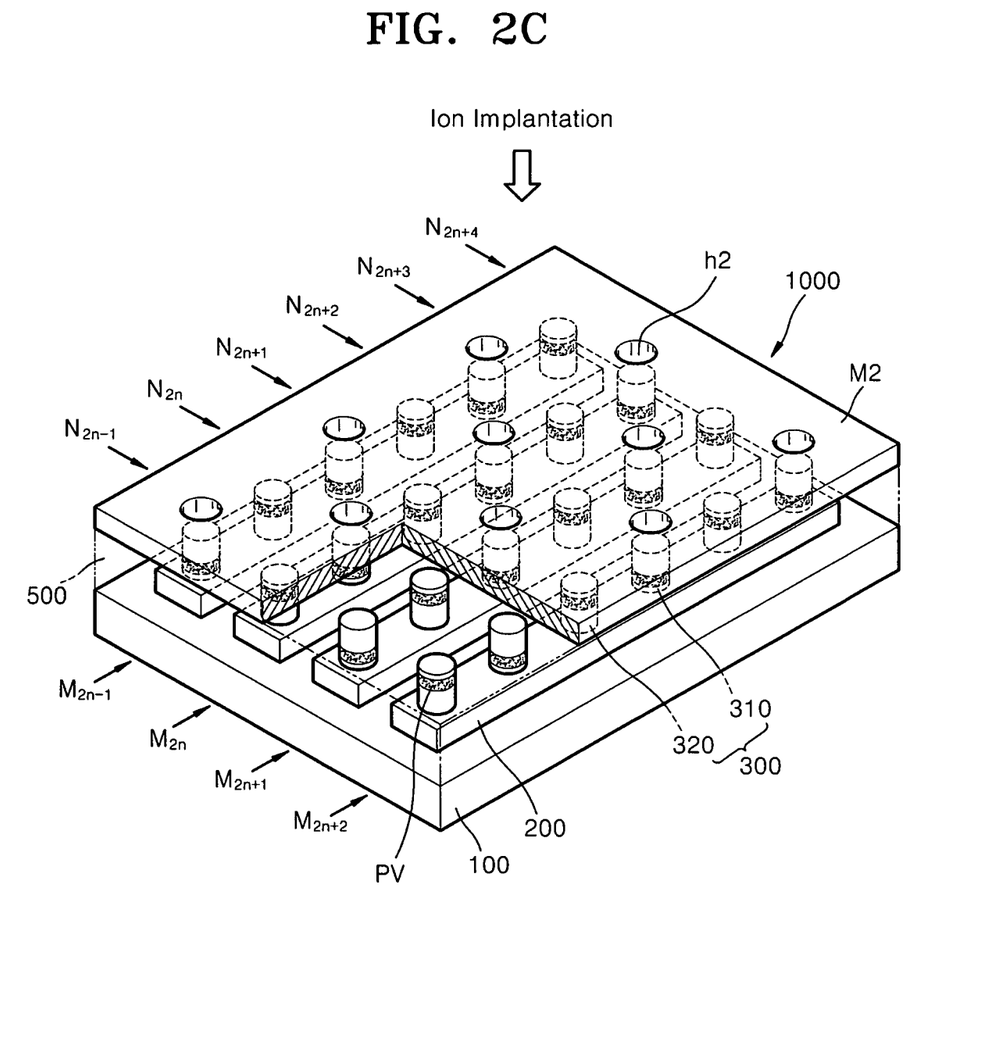

Next, the first mask M1 may be removed, followed by positioning of a second mask M2, e.g., a photoresist mask, above the interlayer insulating layer 500, as illustrated in FIG. 2C. The second mask M2 may have second holes (h2) completely overlapping with cross points (a). Then, impurity elements may be implanted, e.g., via ion implantation, through the second holes (h2) of the second mask M2 at a second depth of the exposed planarized resistive memory material 300L. In other words, the first and second holes (h1) and (h2) of the first and second masks M1 and M2 may correspond to different portions of the exposed resistive memory material film 300L, so that formation of the impurity layer at the first and second depths in the via holes (H) may form an alternating matrix pattern. The second depth may be different from the first depth, so that programming regions (PV) at the second depth may be formed in cross points (a). The programming regions (PV) at the different depths may define the first and second resistive memory material layers 310 and 320, thereby providing the vertically non-uniform resistive memory material 300. Impurity implantation may be followed by heat-treatment to activate the impurity layers.

Once the formation of the resistive memory material 300 is complete, the second conductive lines 400 may be formed on the interlayer insulating layer 500 to be electrically connected to the resistive memory material 300. The second conductive lines 400 may be formed in a second direction. The second direction may be perpendicular to the first direction. However, other configurations of the first and second conductive lines 200 and 400, e.g., first and second directions may intersect diagonally at a non-right angle, are within the scope of the present invention.

Figure 3:
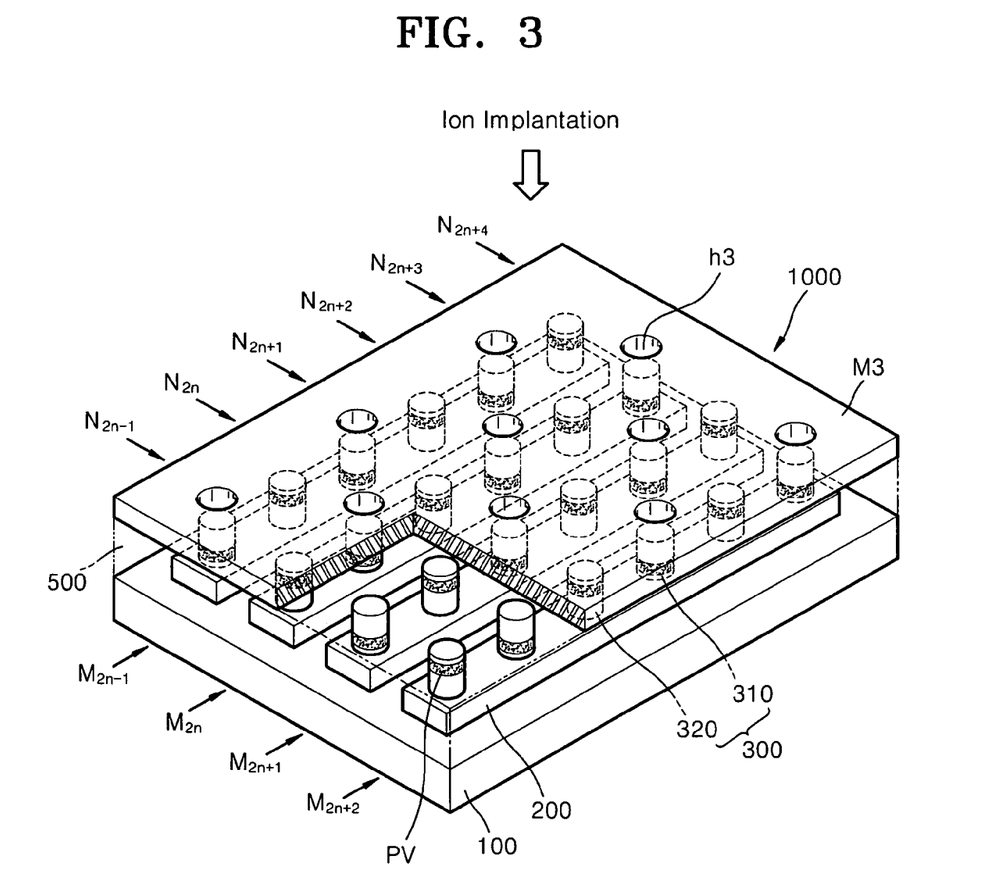
FIG. 3 illustrates a perspective view of a manufacturing method of a semiconductor memory device according to another embodiment of the present invention.

Alternatively, as illustrated in FIG. 3, the resistive memory material 300 of the semiconductor memory device 1000 may be formed by using a third mask M3, as opposed to using the first and second masks M1 and M2, on the interlayer insulating layer 500. The third mask M3 may include third holes (h3) overlapping with cross points (b), i.e., substantially similar to configuration of the second holes (h2) of the second mask M2. The third mask M3 may be used as a screen ion implantation mask, so that impurities may be implanted at lower portions of the planarized resistive memory material 300L through the third holes (h3) and at upper portions of the planarized resistive memory material 300L through the screen portion of the mask M3. For example, impurities implanted through the third holes (h3) of the mask M3 may be implanted at lower portions of cross points (a), i.e., at intersection points of odd rows ($\ldots, M_{2n-1}, M_{2n+1}, \ldots$) and odd columns ($\ldots, N_{2n-1}, N_{2n+1}, N_{2n+3}, \ldots$), and intersection points of even rows ($\ldots, M_{2n}, M_{2n+2}, \ldots$) and even columns ($\ldots, N_{2n}, N_{2n+2}, N_{2n+4}, \ldots$). Due to the screen effect of the third mask M3, i.e., implantation through portions not having the third holes (h3), impurities may be implanted at upper portions of the cross points (b), i.e., at intersection points of odd rows ($\ldots, M_{2n-1}, M_{2n+1}, \ldots$) and even columns ($\ldots, N_{2n}, N_{2n+2}, N_{2n+4}, \ldots$) and intersection points of even rows ($\ldots, M_{2n}, M_{2n+2}, \ldots$) and odd columns ($\ldots, N_{2n-1}, N_{2n+1}, N_{2n+3}, \ldots$), because of insufficient energy to penetrate the planarized resistive memory material film 300L. The third mask M3 may be formed of silicon nitride or silicon oxide.

Figure 4:
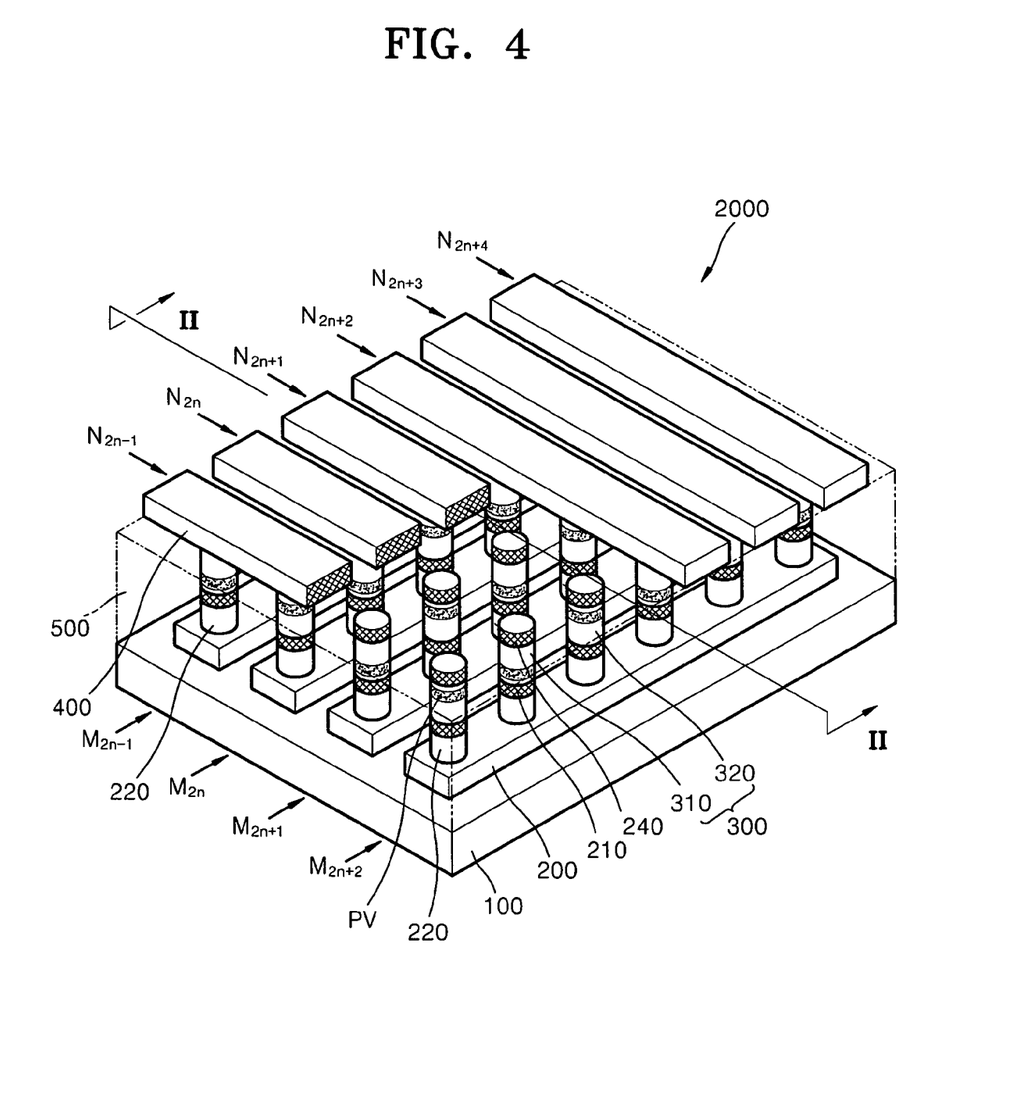
FIGS. 4-5 illustrate perspective and cross-sectional views, respectively, of a semiconductor memory device according to other embodiments of the present invention.
Figure 5:
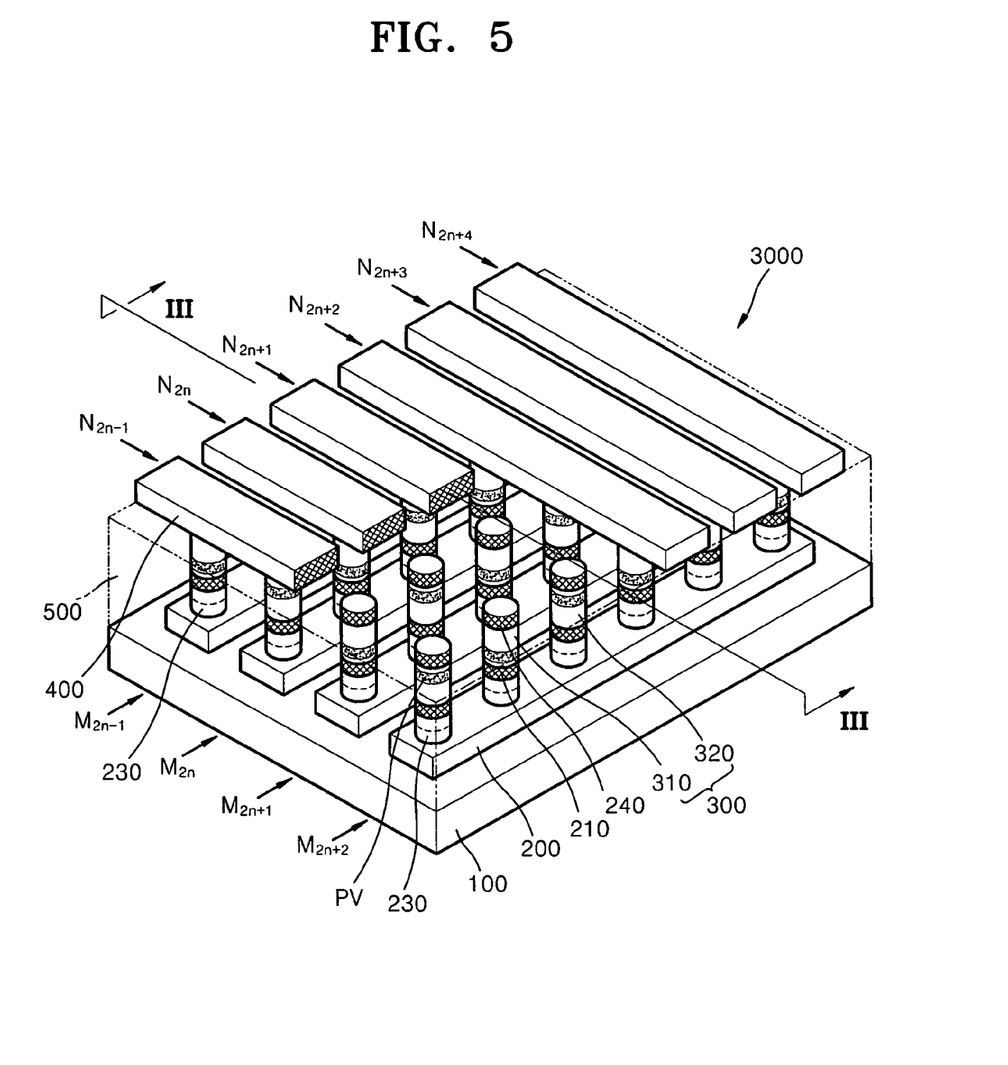
Figure 6:
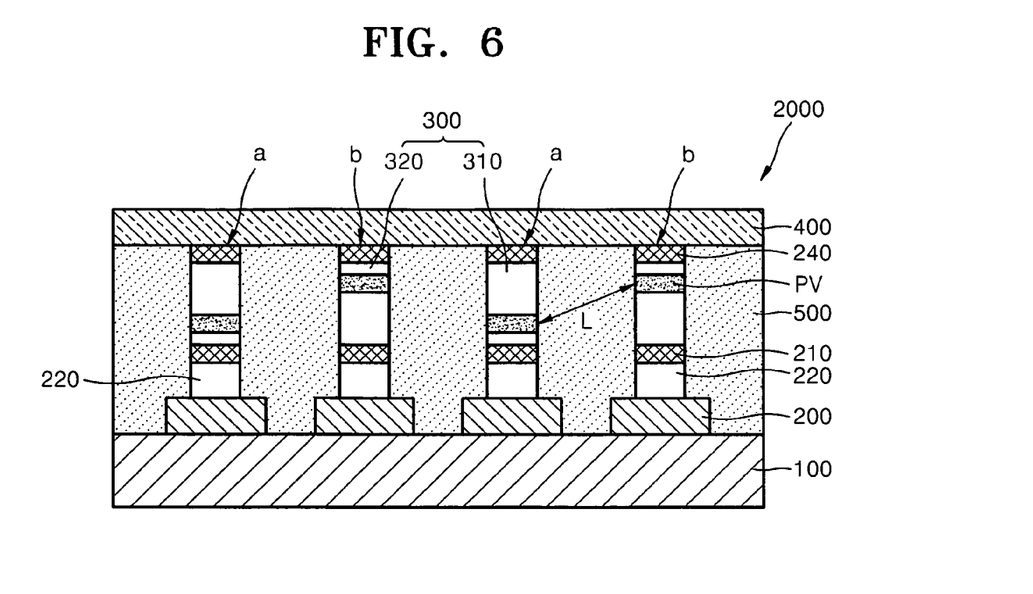
FIGS. 6-7 illustrate cross-sectional views of the semiconductor memory devices of FIGS. 4-5, respectively along lines II and III, respectively.
Figure 7:
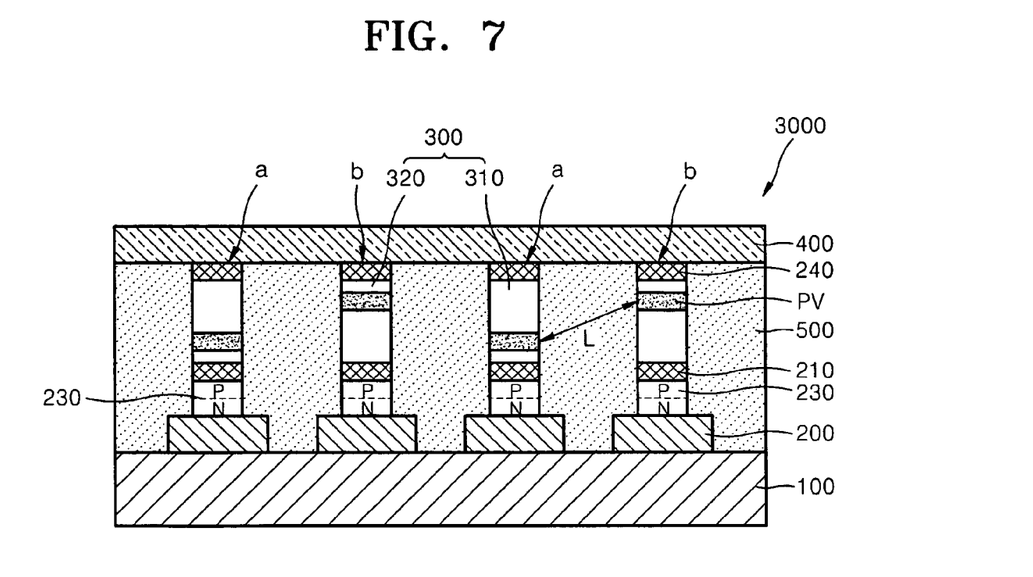

FIGS. 4 and 5 are perspective views illustrating semiconductor memory devices 2000 and 3000, respectively, according to various embodiments of the present invention. FIGS. 6 and 7 are cross-sectional views of the devices of FIGS. 4 and 5, respectively along lines II and III, respectively.

The semiconductor memory devices 2000 and 3000 include at least one of a lower electrode 210 and an upper electrode 240 for a resistive memory material 300 therebetween. The lower electrodes 210 and/or upper electrodes 240 may be formed in the via holes (H) between the first conductive lines 200 and the second conductive lines 400. The lower electrodes 210 of the semiconductor memory device 2000 and 3000 may be formed of a noble metal-based material, e.g., iridium (Ir), platinum (Pt), ruthenium (Ru), or a combination thereof, polysilicon, tungsten (W), titanium nitride (TiN), titanium aluminum nitride (TiAlN), or a combination thereof. Tungsten has excellent characteristics as a material for a bottom electrode. The upper electrodes 240 may be formed of a material similar to that of the lower electrodes 210.

In some embodiments of the present invention, as illustrated in FIG. 4, the semiconductor memory device 2000 may include a conductive plug 220 in contact with the first conductive line 200. In other embodiments of the present invention, as illustrated as illustrated in FIG. 5, the semiconductor memory device 3000 may include diodes 230 in contact with the first conductive line 200. The conductive plugs 220 of the semiconductor memory device 2000 may be connected in series between the lower electrodes 210 and the first conductive lines 200, and may be positioned in the via holes (H). The diodes 230 of the semiconductor memory device 3000 may be connected in series between the first conductive lines 200 and the lower electrodes 210 in the via hole (H). In other embodiments of the present invention, the semiconductor memory device may include both of conductive plug 220 and diode 230 in series.

Connecting the conductive plugs 220 and/or the diodes 230 in series between the first conductive lines 200 and the resistive memory material layers 300 may substantially minimize or prevent current leakage between adjacent operational and non operational cross points. More specially, in the conventional semiconductor memory device, when programming is performed at a selected cross point and a resistive memory material at a non selected cross point neighboring the selected cross point has low electrical resistance, a portion of current for programming the selected cross point may leak out through the non selected cross point. When the current leak out through the neighboring non selected cross points, programming current through the resistive memory material of the selected cross point may be insufficient and, thus, the programming of the selected cross point may fail. The diodes 230 may maintain proper current levels at operational cross points by preventing leakage current through the non selected cross point, thereby minimizing erroneous and/or malfunctioning programming operation. It should be noted, however, that use of other devices capable of acting as rectifiers instead of the diodes 230 are within the scope of the present invention.

Figure 8:
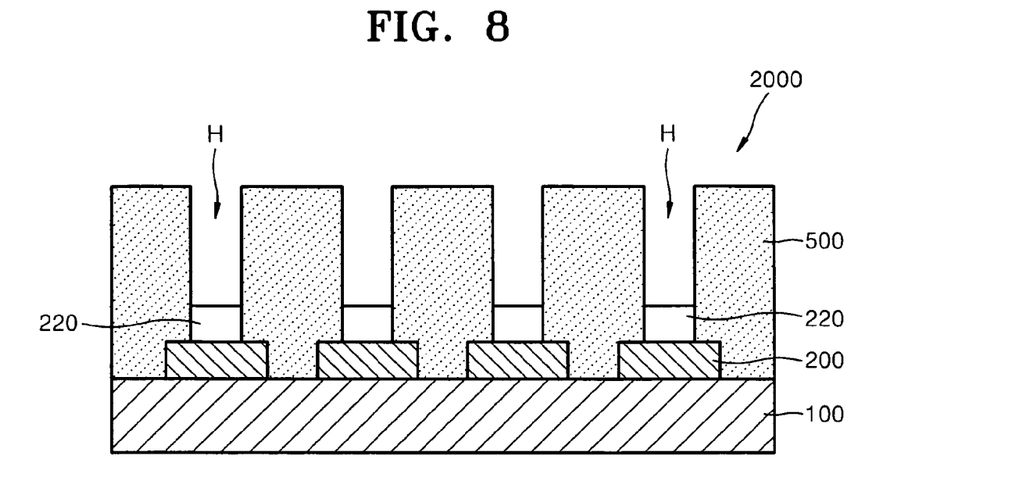
FIGS. 8-13 illustrate cross-sectional views of sequential steps during a manufacturing method of a semiconductor memory device according to another embodiment of the present invention.
Figure 9:
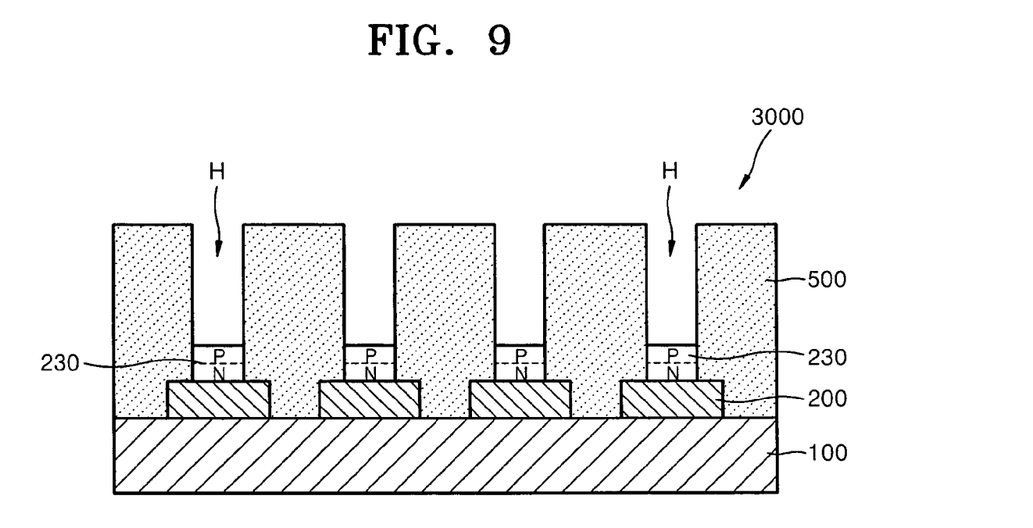

A method of manufacturing the semiconductor memory devices 2000 and 3000 may be as follows. As illustrated in FIGS. 8 and 9, the first conductive lines 200 and the interlayer insulating layer 500 may be sequentially formed on the substrate 100. A plurality of via holes (H) may be formed at predetermined locations through the interlayer insulating layer 500 to expose the upper surfaces of the first conductive lines 200. Referring to FIG. 8, to form the conductive plug 220, a conductive material layer, such as conductive polysilicon layer, may be deposited on the interlayer insulating layer 500 and into the via holes (H) therein. Using, for example, a chemical mechanical polishing (CMP) process or an etchback process, planarization is performed until the upper surface of the interlayer insulating layer 500 is exposed. The conductive material layer remaining in the via holes (H) may recessed, for example, using a plasma etching process to form the conductive plug 220.

The diode 230 may formed using a process similar to that described for forming the conductive plug 220. Referring to FIG. 9, a semiconductor material layer, such as a polysilicon layer, is formed, planarized and recessed to form a semiconductor material region in the bottom of the via holes (H) in the interlayer insulating layer 500. Then, n-type and p-type impurity ions may be sequentially implanted into the semiconductor material to form the diode 230 with P-N junctions. A heating process may be further performed to activate the impurity ions.

Figure 10:
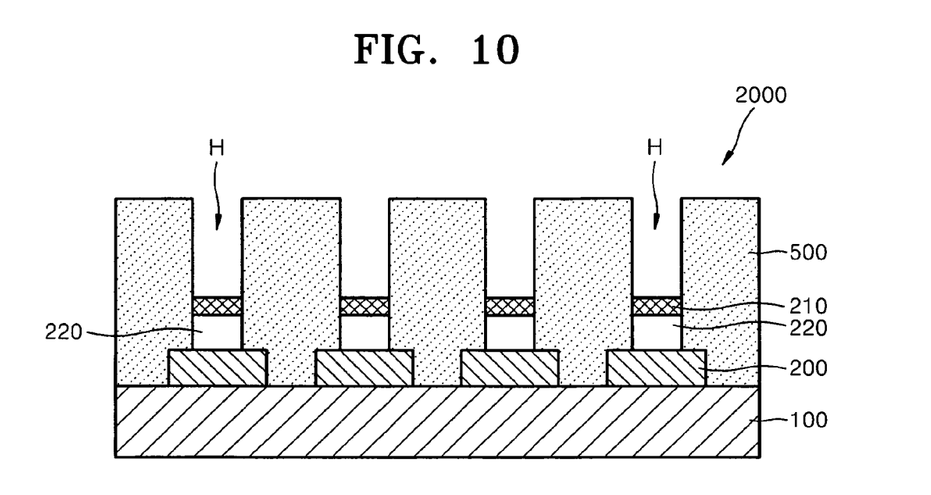
Figure 11:
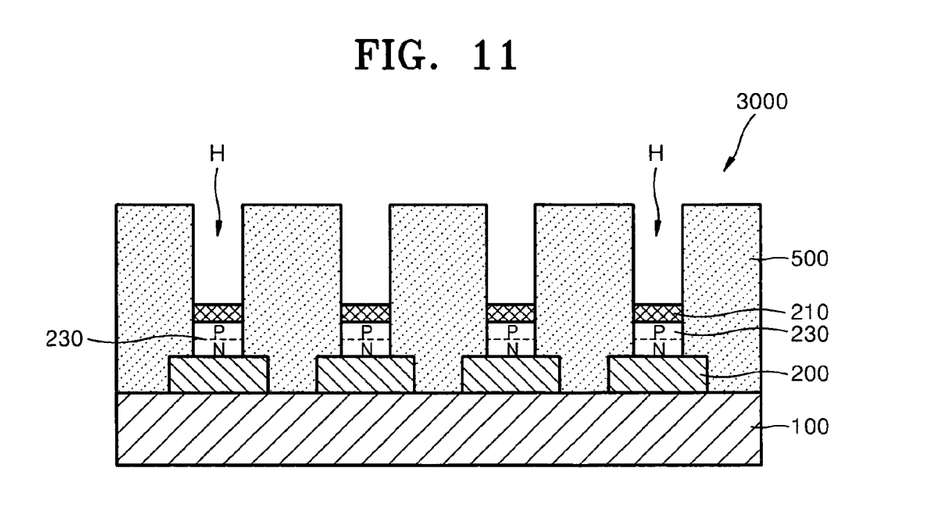

Subsequently, as illustrated in FIGS. 10-11, the lower electrodes 210 may be formed in via hole (H), i.e., on the conductive plugs 220 or on the diodes 230. The lower electrodes 210 may be formed via a substantially similar process as the conductive plugs 220, and therefore, their detailed formation will not be repeated herein.

Figure 12:
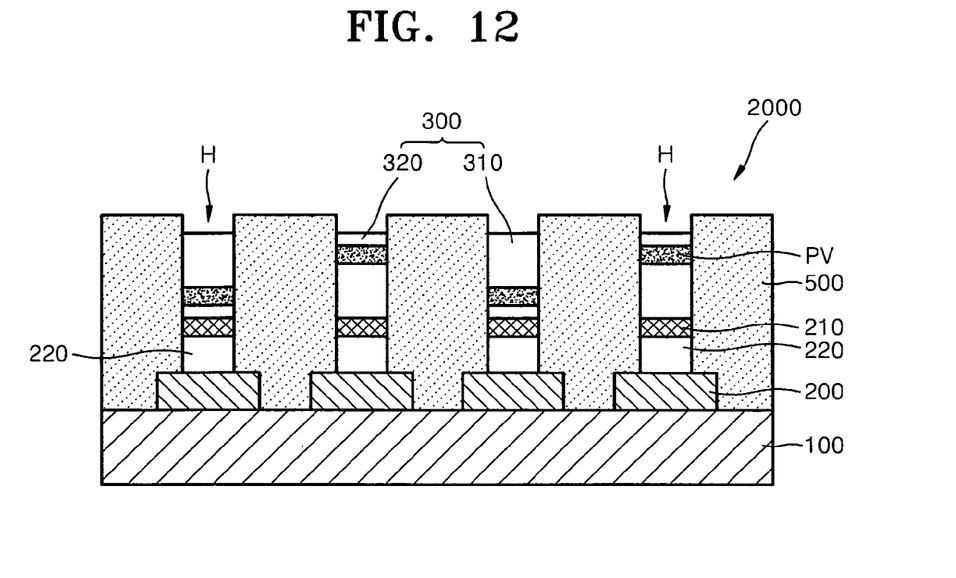
Figure 13:
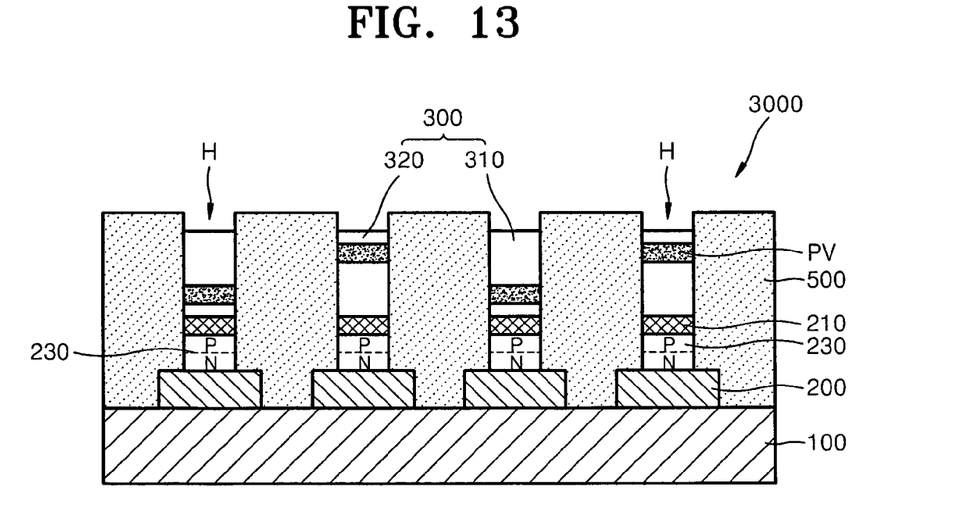

Next, as illustrated in FIGS. 12-13, the resistive memory material 300 may be deposited in each via holes (H) according to a process described previously with respect to FIGS. 2-3, followed by ion implantation to form non-uniform specific resistance profiles in a vertical direction with respect to the substrate 100, such that the first and second resistive memory material layers 310 and 320 are formed. Then, second conductive lines 400 may be formed on the interlayer insulating layer 500.

If upper electrodes 240 are used in the semiconductor memory device 2000 and 3000, the resistive memory material 300 may be recessed, e.g., by plasma etching. Resultantly, spaces for forming the upper electrodes 240 within the via holes (H) may be provided. The upper electrodes 240 may be formed in upper portions of the via holes (H) of a substantially similar material and in a substantially similar process as the lower electrodes 210, i.e., locally formed in the interlayer insulating layer 500. Alternatively, the resistive memory material 300 may be planarized to be at a substantially similar vertical level as an upper surface of the interlayer insulating layer 500, followed by formation of the upper electrodes 240 as lines, i.e., lines corresponding in shape to the second conductive lines 400. Formation of the upper electrodes 240 may be performed with respect to contact characteristics of the resistive memory material 300 therewith. The second conductive lines 400 may be formed to be electrically connected to the upper electrodes 240.

It should be noted with respect to the manufacturing method of the semiconductor memory devices 1000-3000 that the resistive memory material 300 may be locally formed within the interlayer insulating layer 500 or outside the interlayer insulating layer 500. Further, structure and formation of the conductive plugs, diodes, upper electrodes, and lower electrodes may be configured with respect to one of ordinary skill in the art.

The semiconductor memory device and the manufacturing method thereof according to embodiments of the present invention may include resistive memory material layers with vertically non-uniform specific resistance profiles with respect to a substrate thereof, thereby increasing a distance between programming regions of adjacent resistive memory material layers with a reduced gap therebetween. Such a structure of resistive memory material layers in a semiconductor memory device may be advantageous in substantially minimizing thermal interference between adjacent cross points, thereby substantially reducing erroneous operation of the memory device, facilitating a higher degree of integration, and reducing manufacturing costs.

Exemplary embodiments of the present invention have been disclosed herein, and although specific terms are employed, they are used and are to be interpreted in a generic and descriptive sense only and not for purpose of limitation. Accordingly, it will be understood by one of ordinary skill in the art that various changes in form and details may be made without departing from the spirit and scope of the present invention as set forth in the following claims.

What is claimed is:

1. A semiconductor memory device, comprising:
    first conductive lines on a substrate;
    an interlayer insulating layer with a plurality of via holes on the substrate at the same height with respect to the substrate;
    second conductive lines on the interlayer insulating layer; and
    a resistive memory material substantially completely filling each of the via holes and electrically connected to the first and second conductive lines, the resistive memory material having at least one specific resistance region that has a higher resistance than other regions of the resistive memory material in each of the via holes, wherein:
    the resistive memory material includes first and second resistive memory material layers in respective via holes adjacent to one another, a position of a higher specific resistance region in the first resistive memory material layer being different from a position of the higher specific resistance region in the second resistive memory material layer, and
    the higher specific resistance region in the second resistive memory material layer has a higher position and has a greater amount of resistive memory material between the higher specific resistance region and the first conductive lines than the position and the amount of resistive memory material between the first conductive lines and the higher specific resistance region in the first resistive memory material layer.

2. The semiconductor memory device as claimed in claim 1, wherein the first and second resistive memory material layers have an alternating matrix pattern.

3. The semiconductor memory device as claimed in claim 2, wherein the first resistive memory material layers are at intersection points of odd rows and odd columns of the matrix pattern and at intersection points of even rows and even columns of the matrix pattern.

4. The semiconductor memory device as claimed in claim 1, wherein the resistive memory material includes a germanium-antimony-tellurium-based material.

5. The semiconductor memory device as claimed in claim 1, further comprising lower electrodes in each of the via holes between the first conductive lines and the resistive memory material.

6. The semiconductor memory device as claimed in claim 1, further comprising conductive plugs and/or diodes in each of the via holes between the first conductive lines and the resistive memory material.

7. The semiconductor memory device as claimed in claim 1, further comprising upper electrodes between the resistive memory material and the second conductive lines.

8. The semiconductor memory device as claimed in claim 1, wherein the first conductive lines are word lines and the second conductive lines are bit lines.

9. A method of manufacturing a semiconductor memory device, comprising:
forming first conductive lines on a substrate;
forming an interlayer insulating layer with via holes on the substrate at the same height with respect to the substrate;
forming a resistive memory material substantially completely filling each of the via holes and to be electrically connected to the first lines, the resistive memory material having at least one high specific resistance region that has a higher resistance than other regions of the resistive memory material in each of the via holes, and
forming second conductive lines to be electrically connected to the resistive memory material on the interlayer insulating layer, wherein
the resistive memory material includes first and second resistive memory material layers in respective via holes adjacent to one another, a position of a higher specific resistance region in the first resistive memory material layer being different from a position of the higher specific resistance region in the second resistive memory material layer, and
the higher specific resistance region in the second resistive memory material layer has a higher position and has a greater amount of resistive memory material between the higher specific resistance region and the first conductive lines than the position and the amount of resistive memory material between the first conductive lines and the higher specific resistance region in the first resistive memory material layer.

10. The method as claimed in claim 9, wherein forming the higher specific resistance regions in the first and second resistive memory material layers includes depositing impurity layers at first and second depths of the corresponding via holes, the first and second depths being different from one another.

11. The method as claimed in claim 10, wherein depositing the impurity layers at the first and second depths includes using a first ion implantation mask with first holes to implant first impurity layers at the first depth, and using a second ion implantation mask with second holes to implant second impurity layers at the second depth, the first and second impurity layers being adjacent to each other.

12. The method as claimed in claim 11, wherein depositing the impurity layers includes forming the first and second impurity layers in an alternating matrix pattern, the first depth corresponding to lower portions of the first resistive memory material layer and the second depth corresponding to upper portions of the second resistive memory material layer.

13. The method as claimed in claim 10, wherein depositing the impurity layers includes implanting ions of one or more of boron, carbon, nitrogen, oxygen, silicon, tantalum, tin, indium, and titanium.

14. The method as claimed in claim 10, wherein depositing the impurity layers at the first and second depths includes using a third ion implantation mask with third holes to implant impurities at the first and second depths simultaneously by way of screen ion implantation.

15. The method as claimed in claim 9, further comprising forming lower electrodes in each of the via holes of iridium, platinum, ruthenium, polysilicon, tungsten, titanium nitride, titanium aluminum nitride, or a combination thereof.

16. The method as claimed in claim 9, further comprising forming upper electrodes in the via holes or on the resistive material of iridium, platinum, ruthenium, polysilicon, tungsten, titanium nitride, titanium aluminum nitride, or a combination thereof.

17. The method as claimed in claim 9, further comprising forming at least one of conductive plugs and diodes in each of the via holes to be electrically connected to the first conductive lines.

* * * * *